(12) United States Patent
Maeda et al.

(10) Patent No.: US 11,302,675 B2
(45) Date of Patent: Apr. 12, 2022

(54) SEMICONDUCTOR DEVICE AND METHOD FOR MANUFACTURING THE SAME

(71) Applicant: Kioxia Corporation, Tokyo (JP)

(72) Inventors: Takeori Maeda, Mie Mie (JP); Yuusuke Takano, Yokkaichi Mie (JP); Soichi Homma, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/007,849

(22) Filed: Aug. 31, 2020

(65) Prior Publication Data
US 2021/0257336 A1 Aug. 19, 2021

(30) Foreign Application Priority Data
Feb. 17, 2020 (JP) .............................. JP2020-024545

(51) Int. Cl.
*H01L 21/48* (2006.01)
*H01L 25/065* (2006.01)
*H01L 21/306* (2006.01)
*H01L 21/56* (2006.01)
(Continued)

(52) U.S. Cl.
CPC .... *H01L 25/0657* (2013.01); *H01L 21/30625* (2013.01); *H01L 21/4853* (2013.01); *H01L 21/563* (2013.01); *H01L 21/78* (2013.01); *H01L 25/50* (2013.01); *H01L 2225/0651* (2013.01); *H01L 2225/06506* (2013.01); *H01L 2225/06517* (2013.01); *H01L 2225/06562* (2013.01);
(Continued)

(58) Field of Classification Search
CPC ............. H01L 23/5389; H01L 23/3128; H01L 23/5383; H01L 23/5386; H01L 21/4853; H01L 21/4857; H01L 21/565; H01L 21/568; H01L 21/6835; H01L 24/19; H01L 24/20; H01L 25/0657; H01L 25/105; H01L 2221/68372; H01L 2224/214; H01L 2225/0651; H01L 2225/06568; H01L 2225/1035; H01L 2225/1058
See application file for complete search history.

(56) References Cited

U.S. PATENT DOCUMENTS

2018/0076187 A1 3/2018 Karakane et al.
2019/0319011 A1 10/2019 McGeehan et al.

FOREIGN PATENT DOCUMENTS

JP H04-127649 U 11/1992
JP 5827043 B2 12/2015
JP 2016-225492 A 12/2016

*Primary Examiner* — Timor Karimy
(74) *Attorney, Agent, or Firm* — Foley & Lardner LLP

(57) ABSTRACT

A semiconductor device includes a first semiconductor chip having a first surface and a second surface; a first adhesive layer on the first surface; a second semiconductor chip that includes a third surface and a fourth surface, and a connection bump on the third surface. The connection bump is coupled to the first adhesive layer. The semiconductor device includes a wiring substrate connected to the connection bump. The semiconductor device includes a first resin layer covering the connection bump between the second semiconductor chip and the wiring substrate, and covers one side surface of the second semiconductor chip connecting the third surface and the fourth surface. The first adhesive layer covers an upper portion of the at least one side surface. The first resin layer covers a lower portion of the at least one side surface. The first adhesive layer and the first resin layer contact each other.

8 Claims, 16 Drawing Sheets

(51) Int. Cl.
 *H01L 21/78* (2006.01)
 *H01L 25/00* (2006.01)
(52) U.S. Cl.
 CPC ............... *H01L 2225/06575* (2013.01); *H01L 2225/06582* (2013.01)

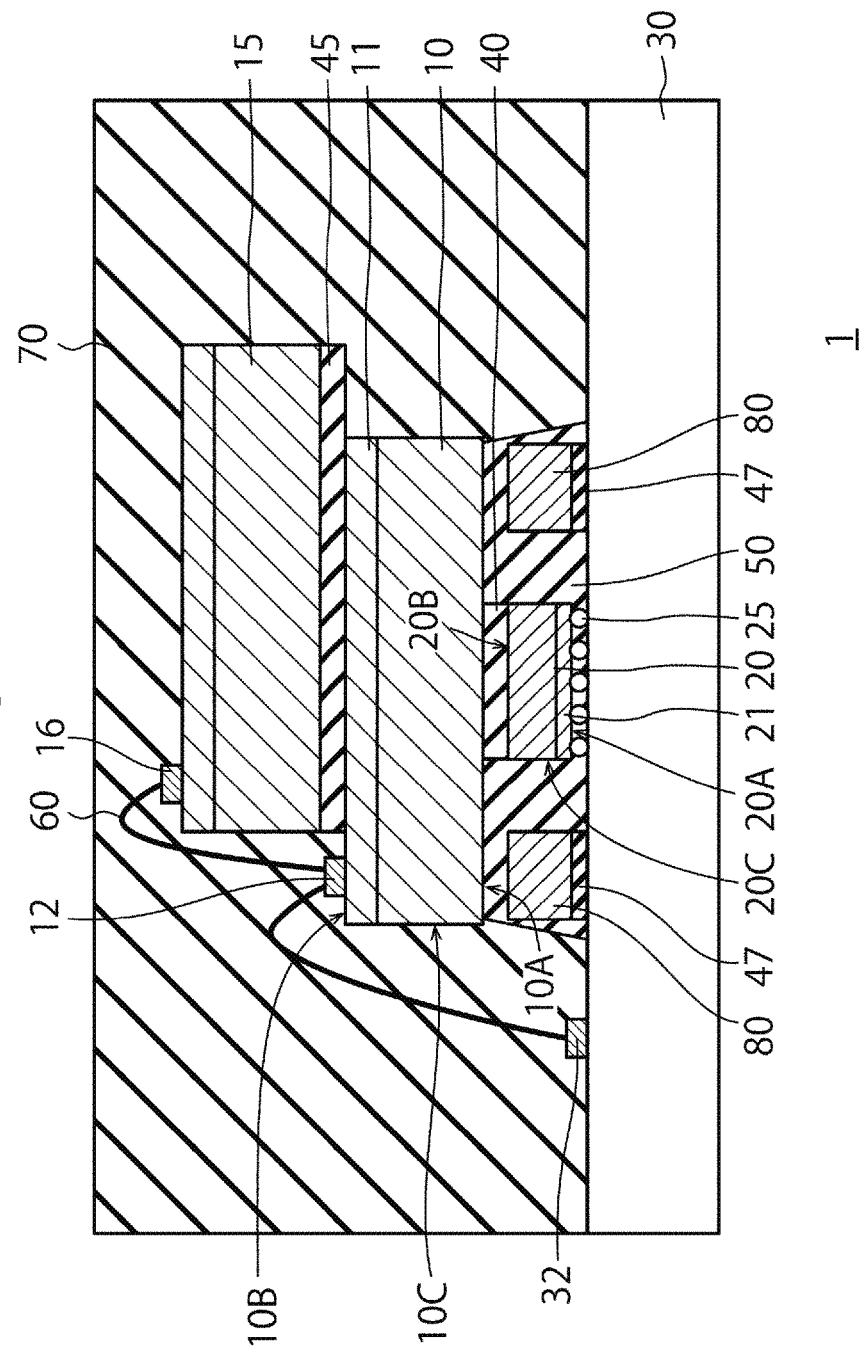

SEMICONDUCTOR DEVICE AND METHOD FOR MANUFACTURING THE SAME

CROSS-REFERENCE TO RELATED APPLICATION(S)

This application is based upon and claims the benefit of priority from Japanese Patent Application No. 2020-024545, filed Feb. 17, 2020, the entire contents of which are incorporated herein by reference.

FIELD

Embodiments described herein relate generally to a semiconductor device and a method for manufacturing the same.

BACKGROUND

When a semiconductor chip is flip-chip connected to an interposer substrate, an underfill that covers a bump of the semiconductor chip creeps up along a side surface of the semiconductor chip. Such creeping-up of the underfill causes the underfill to adhere to a mounting tool, which presses the semiconductor chip. In this regard, protecting the mounting tool with a film has been proposed. However, it is required to forma suction hole in the film for each semiconductor chip, thereby causing deterioration in throughput. Since the film is exchanged for each mounting process, the cost of the film is high.

When connection is performed with mass reflow, warpage of the semiconductor chip may cause occurrence of connection failure of the bump.

DESCRIPTION OF THE DRAWINGS

FIG. 27 is a cross-sectional view illustrating a configuration example of a semiconductor device according to an eleventh embodiment.

DETAILED DESCRIPTION

Embodiments provide a semiconductor device capable of preventing a resin from adhering to a mounting tool and surely connecting a semiconductor chip to a substrate, and a method for manufacturing the same.

In general, according to one embodiment, a semiconductor device includes a first semiconductor chip having a first surface and a second surface opposite to the first surface. The semiconductor device includes a first adhesive layer provided on the first surface. The semiconductor device includes a second semiconductor chip including: a third surface and a fourth surface opposite to the third surface; and a connection bump on the third surface. The connection bump is coupled to the first adhesive layer. The semiconductor device includes a wiring substrate connected to the connection bump. The semiconductor device includes a first resin layer that covers the connection bump between the second semiconductor chip and the wiring substrate, and further covers at least one side surface of the second semiconductor chip connecting the third surface and the fourth surface. The first adhesive layer covers an upper portion of the at least one side surface. The first resin layer covers a lower portion of the at least one side surface. The first adhesive layer and the first resin layer contact each other.

Hereinafter, embodiments according to the present disclosure will be described with reference to the drawings. The embodiments do not limit the present disclosure. In the following embodiment, a vertical direction of a substrate indicates a relative direction when a surface on which a semiconductor chip is mounted is defined as "UP", and may be different from a vertical direction according to acceleration of gravity. The drawings are schematic or conceptual, and a proportion of each portion is not necessarily the same as that of the actual one. In the specification and the drawings, the same elements as those described above with reference to the already illustrated drawings will be denoted by the same reference signs, and detailed description thereof will be appropriately omitted.

First Embodiment

Figure 1:
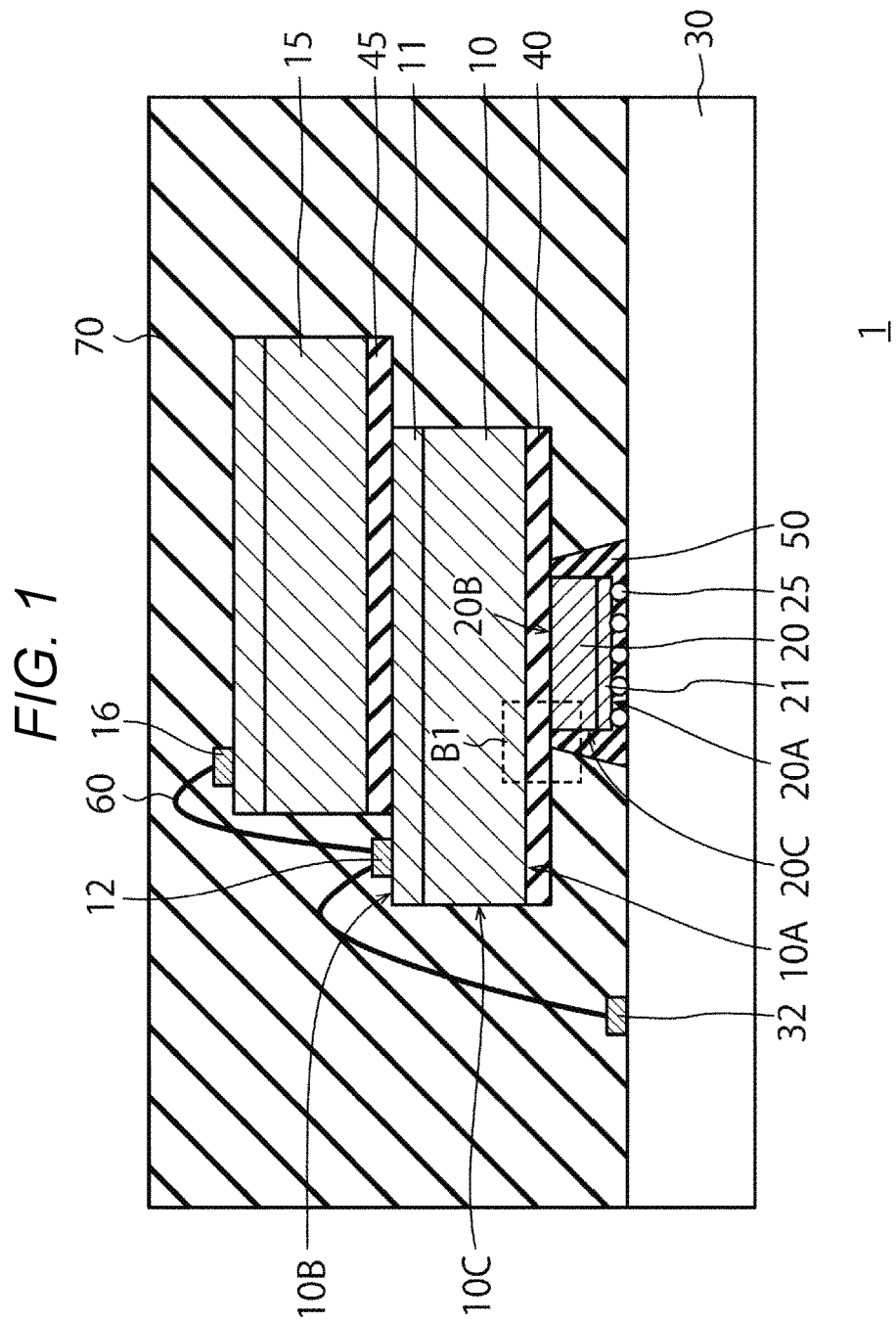
FIG. 1 is a cross-sectional view illustrating a configuration example of a semiconductor device according to a first embodiment.

FIG. 1 is a cross-sectional view illustrating a configuration example of a semiconductor device according to a first embodiment. A semiconductor device 1 includes semiconductor chips 10, 15, and 20, a wiring substrate 30, adhesive layers 40 (a first resin layer) and 45, a resin layer 50 (a second resin layer), a bonding wire 60, and a sealing resin 70 (a third resin layer).

The semiconductor device 1 is, for example, a package of a NAND type flash memory. The semiconductor chip 10 is, for example, a memory chip of the NAND type flash memory. The semiconductor chip 10 includes a rear surface 10A, a front surface 10B on the opposite side of the rear surface 10A, and a side surface 10C between the rear surface 10A and the front surface 10B. A semiconductor element 11 is provided on the front surface 10B of the semiconductor chip 10 and is covered with a protective film such as polyimide. The semiconductor element 11 may be, for example, a memory cell array or a peripheral circuit (a complementary metal oxide semiconductor (CMOS) circuit). The memory cell array may be a three-dimensional memory cell array in which a plurality of memory cells are arranged three-dimensionally. A pad 12 electrically connected to anyone of the semiconductor elements 11 is provided on the front surface 10B.

The adhesive layer 40 is provided on the rear surface 10A of the semiconductor chip 10. The adhesive layer 40 is, for example, a die attachment film (DAF), and adheres between the semiconductor chip 10 and the semiconductor chip 20.

The semiconductor chip 20 is, for example, a controller chip that controls a memory chip. The semiconductor chip 20 includes a rear surface 20A that faces the wiring substrate, a front surface 20B on the opposite side of the rear surface 20A, and a side surface 20C between the rear surface 20A and the front surface 20B. A semiconductor element 21 is provided on the rear surface 20A of the semiconductor chip 20, and is covered with a protective film such as polyimide. The semiconductor element 21 may be, for example, the CMOS circuit forming a controller. A bump 25 electrically connected to the semiconductor element 21 is provided on the rear surface 20A. For example, a low resistance metal material such as solder is used for the bump 25.

The front surface 20B of the semiconductor chip 20 adheres to the rear surface 10A of the semiconductor chip 10 via the adhesive layer 40.

Although not illustrated, the wiring substrate 30 may be, for example, a printed substrate and an interposer including a plurality of wiring layers and a plurality of insulating layers. For example, a low resistance metal such as copper is used for the wiring layer. For example, an insulating material such as glass epoxy resin is used for the insulating layer. A pad 32 electrically connected to any one of the wiring layers is provided on the front surface of the wiring substrate 30. The metal bump 25 of the semiconductor chip 20 is connected to the wiring layer via a pad (not illustrated) on the front surface of the wiring substrate 30. Accordingly, the semiconductor chips 10 and 20 can be controlled via the wiring layer of the wiring substrate 30.

The resin layer 50 is, for example, a resin such as an underfill or a non-conductive paste (NCP). The resin layer 50 covers the bump 25 provided between the semiconductor chip 20 and the wiring substrate 30, and protects the connection between the bump 25 and the wiring substrate 30. When the bump 25 of the semiconductor chip 20 is connected to the wiring substrate 30, the resin layer 50 is supplied as a liquid. Therefore, the resin layer 50 fills a space between the semiconductor chip 20 and the wiring substrate 30, creeps up along the side surface 20C of the semiconductor chip 20, and covers at least a lower portion of the side surface 20C. A configuration of the resin layer 50 will be illustrated later with reference to FIG. 2.

Another semiconductor chip 15 may be stacked on the front surface 10B of the semiconductor chip 10. The semiconductor chip 15 adheres to the front surface 10B of the semiconductor chip 10 via the adhesive layer 45. The semiconductor chip 15 may be a memory chip having the same configuration as that of the semiconductor chip 10 or a semiconductor chip having another configuration. In the drawing, in addition to the semiconductor chip 20 serving as a controller chip, two semiconductor chips 10 and 15 are stacked. However, the number of stacked semiconductor chips may be three or more. A plurality of controller chips may be disposed in parallel to the surface of the wiring substrate 30.

The bonding wire 60 connects the pads 12, 16, and 32 of the semiconductor chips 10, 15, and 20.

The sealing resin 70 embeds and seals the semiconductor chips 10, 15, and 20, the resin layer 50, and the bonding wire 60. Accordingly, the semiconductor device 1 is configured with a plurality of the semiconductor chips 10, 15, and 20 as one semiconductor package.

Figure 2:
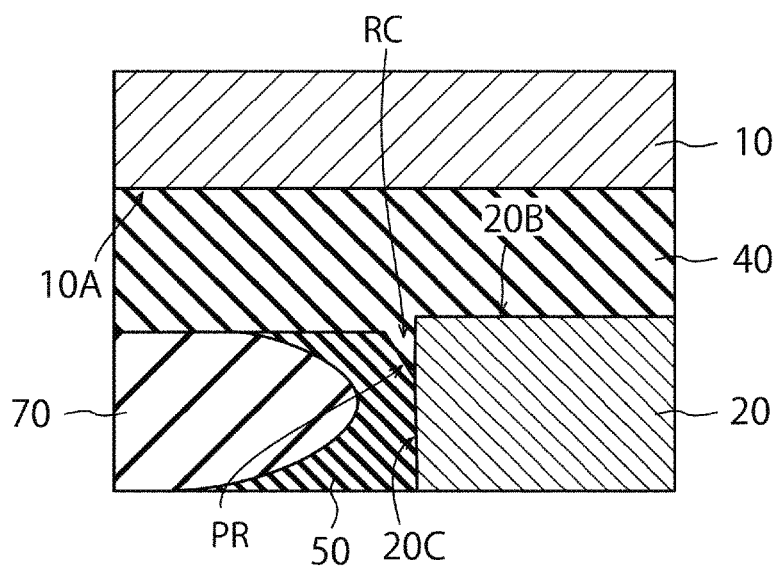
FIG. 2 is a cross-sectional view illustrating a more detailed configuration inside a frame B1 in FIG. 1.

FIG. 2 is a cross-sectional view illustrating a more detailed configuration inside a frame B1 in FIG. 1. In the embodiment, the adhesive layer 40 is provided between the rear surface 10A of the semiconductor chip 10 and the front surface 20B of the semiconductor chip 20, and covers an upper portion of the side surface 20C of the semiconductor chip 20. That is, the adhesive layer 40 covers the semiconductor chip 20 from the front surface 20B thereof to the upper portion of the side surface 20C thereof halfway.

On the other hand, as described above, the resin layer 50 creeps up from the rear surface 20A of the semiconductor chip 20 along the side surface 20C, and covers the lower portion of the side surface 20C. That is, the resin layer 50 covers the semiconductor chip 20 from the rear surface 20A thereof to the lower portion of the side surface 20C thereof halfway.

The adhesive layer 40 and the resin layer 50 contact each other on the side surface 20C, and the sealing resin 70 does not enter therebetween. Therefore, the side surface 20C is covered with the adhesive layer 40 and the resin layer 50, and does not contact the sealing resin 70. The sealing resin 70 is separated from the side surface 20C of the semiconductor chip 20 by the adhesive layer 40 and the resin layer 50.

The resin layer 50 includes a recess RC at a boundary portion between the resin layer 50 and the side surface 20C of the semiconductor chip 20. The adhesive layer 40 includes a protrusion portion PR corresponding to the recess RC at a boundary portion between the adhesive layer 40 and the side surface 20C. In this manner, the recess RC and the protrusion portion PR are formed because the resin layer 50 creeps up along the side surface 20C of the semiconductor chip 20 after the semiconductor chip 10 adheres to the semiconductor chip 20 with the adhesive layer 40. That is, the semiconductor chip 10 adheres to the semiconductor chip 20 with the adhesive layer 40, the bump 25 of the semiconductor chip 20 is connected to the wiring substrate 30, after which the resin layer 50 is supplied between the semiconductor chip 20 and the wiring substrate 30. Alternatively, the semiconductor chip 10 adheres to the semiconductor chip 20 with the adhesive layer 40, and the resin layer 50 is applied to the wiring substrate 30, after which the bump 25 of the semiconductor chip 20 is put in the resin layer 50 and connected to the wiring substrate 30. The recess RC and the protrusion portion PR are formed in the order of the above-described manufacturing process of the semiconductor device 1. Therefore, the recess RC and the protrusion portion PR may be formed not a part of the outer circumference of the semiconductor chip 20 but over the entire circumference.

The semiconductor chip 20 adheres to the adhesive layer 40 before contacting the resin layer 50. Therefore, the adhesive layer 40 covers the whole front surface 20B of the semiconductor chip 20. On the other hand, the resin layer 50 does not contact the front surface 20B of the semiconductor chip 20. That is, the resin layer 50 does not enter between the front surface 20B of the semiconductor chip 20 and the adhesive layer 40, and is not interposed therebetween.

Figure 3:
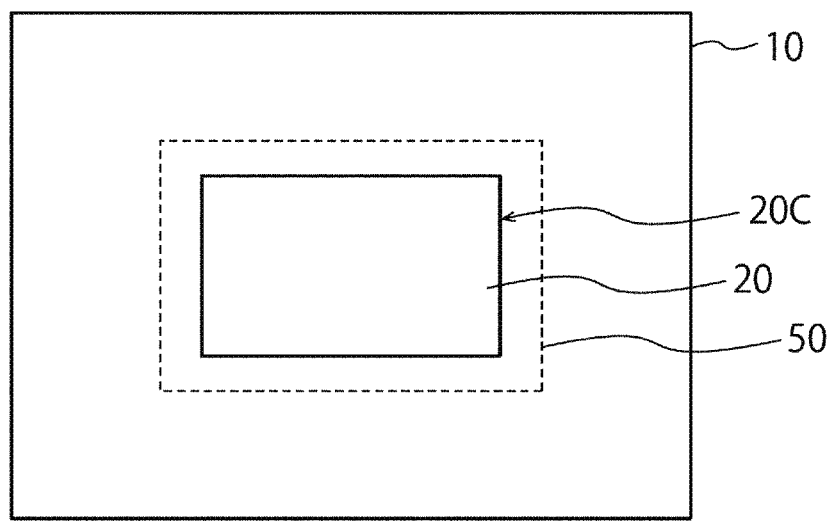
FIG. 3 is a schematic plan view illustrating a positional relationship between a semiconductor chip and a resin layer.

FIG. 3 is a schematic plan view illustrating a positional relationship between the semiconductor chips 10 and 20, and the resin layer 50. The semiconductor chip 10 is larger than the semiconductor chip 20, and when viewed from above the front surface 10B of the semiconductor chip 10, an outer edge of the semiconductor chip 10 is outside (offset from) an outer edge of the semiconductor chip 20. The resin layer 50 is provided on the rear surface 20A and the side surface 20C of the semiconductor chip 20, and surrounds a periphery of the semiconductor chip 20. As illustrated in FIG. 1, the resin layer 50 is also provided between the rear surface 10A of the semiconductor chip 10 and the wiring substrate 30. Since the resin layer 50 creeps up from the side of the rear surface 20A of the semiconductor chip 20, the side surface thereof is formed in a forward taper shape. In the vicinity of the adhesive layer 40, the resin layer 50 has an inclination in a reverse direction in the forward taper shape along a bottom surface of the adhesive layer 40.

Next, a method for manufacturing the semiconductor device 1 according to the embodiment will be described.

FIGS. 4 to 11 are cross-sectional views illustrating an example of the method for manufacturing the semiconductor device according to the first embodiment.

First, a grind resin tape TP1 is stuck to the front surface 10B of the semiconductor chip 10. Next, as illustrate in FIG. 4, while protecting the semiconductor element 11 on the front surface 10B of the semiconductor chip 10 with the grind resin tape TP1, the rear surface 10A of the semiconductor chip 10 is polished and thinned by using a chemical mechanical polishing (CMP) method. At this time, the semiconductor chip 10 is not diced into individual pieces, and is in a state of a semiconductor wafer (a semiconductor substrate) 10W. The rear surface 10A of the semiconductor wafer 10W is polished by the CMP grinder GD. At this time, the semiconductor wafer 10W may be mechanically ground and polished to be thinned, or may be thinned by wet etching.

Figure 5:
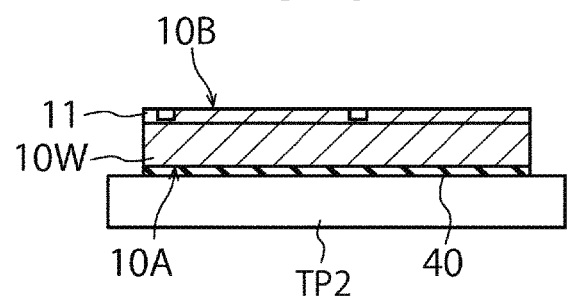
FIG. 5 is a cross-sectional view illustrating an example of the method for manufacturing, following FIG. 4.

Next, the adhesive layer 40 adheres to the rear surface 10A of the semiconductor wafer 10W. Next, as illustrated in FIG. 5, the rear surface 10A of the semiconductor wafer 10W is stuck to a dicing resin tape TP2 via the adhesive layer 40.

Figure 6:
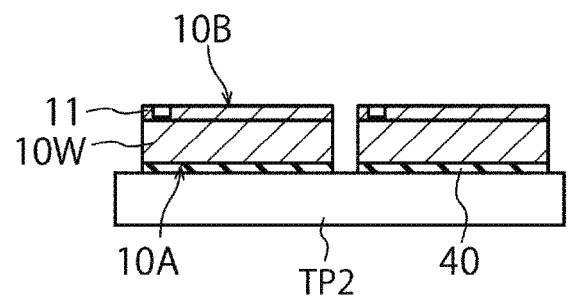
FIG. 6 is a cross-sectional view illustrating an example of the method for manufacturing, following FIG. 5.

Next, as illustrated in FIG. 6, the semiconductor wafer 10W is diced on the dicing resin tape TP2, and the semiconductor wafer 10W is diced into the individual semiconductor chips 10. At this time, since the front surface 10B of the semiconductor wafer 10W is directed upward, alignment of dicing becomes easy. The dicing may be performed by laser dicing or blade dicing. The semiconductor wafer 10W may be diced into the individual semiconductor chips 10 by expanding the dicing resin tape TP2.

Figure 7:
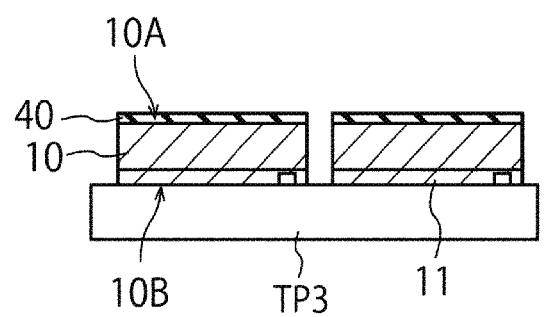
FIG. 7 is a cross-sectional view illustrating an example of the method for manufacturing, following FIG. 6.

Next, as illustrated in FIG. 7, another resin tape TP3 is stuck to the front surface 10B of the semiconductor chip 10 after dicing, and the semiconductor chip 10 is moved to the resin tape TP3. Accordingly, the dicing resin tape TP2 is removed from the adhesive layer 40 and the adhesive layer 40 is exposed.

Figure 8:
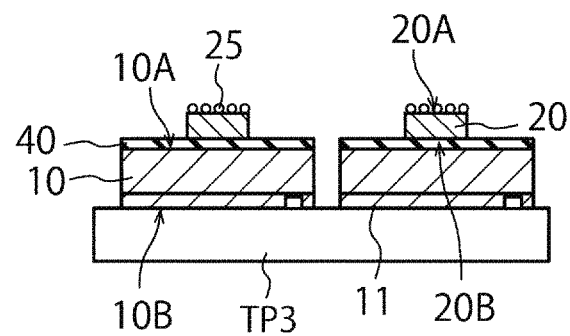
FIG. 8 is a cross-sectional view illustrating an example of the method for manufacturing, following FIG. 7.

Next, as illustrated in FIG. 8, the front surface 20B of the semiconductor chip 20 adheres to the adhesive layer 40 of the rear surface 10A of the semiconductor chip 10. The bump 25 is provided on the rear surface 20A of the semiconductor chip 20. The semiconductor chip 20 adheres thereto so as to correspond to each semiconductor chip 10.

Figure 9:
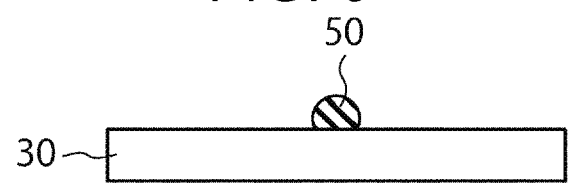
FIG. 9 is a cross-sectional view illustrating an example of the method for manufacturing, following FIG. 8.

Next, as illustrated in FIG. 9, the resin layer 50 having a liquid type material is applied to a connection location of the bump 25 on the surface of the wiring substrate 30. For example, an underfill material or an NCP is used for the resin layer 50. The material of the resin layer 50 may be an NCP containing a reducing agent. Alternatively, after the reducing agent (flux) is supplied to the bump 25, the bump 25 may be flip-chip connected to the wiring substrate 30 while contacting the resin layer 50. The semiconductor chip 20 can be flip-chip connected to the wiring substrate 30 while removing a metal oxide film on the surface of the bump 25 by the reducing agent. Accordingly, contact failure between the bump 25 and the pad of the wiring substrate 30 is prevented.

Figure 10:
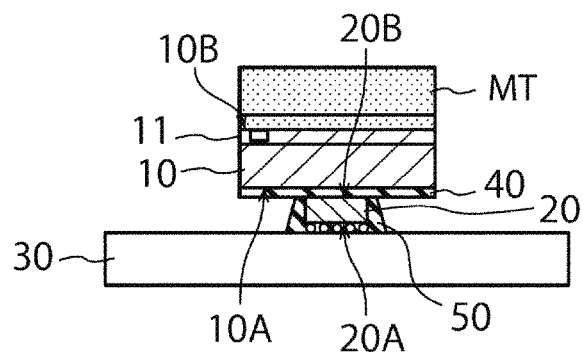
FIG. 10 is a cross-sectional view illustrating an example of the method for manufacturing, following FIG. 9.

Next, the semiconductor chips 10 and 20 in FIG. 8 are picked up by a mounting tool MT. As illustrated in FIG. 10, the mounting tool MT causes the rear surface 10A of the semiconductor chip 10 and the rear surface 20A of the semiconductor chip 20 to face the front surface of the wiring substrate 30, whereby the bump 25 of the semiconductor chip 20 is caused to contact the resin layer 50. The mounting tool MT connects the bump 25 to the wiring substrate 30 in the resin layer 50. The bump 25 is connected to the pad of the wiring substrate 30 by heat treatment. At this time, the resin layer 50 creeps up along the side surface 20C of the semiconductor chip 20. However, since the front surface 20B of the semiconductor chip 20 is covered with the adhesive layer 40, the resin layer 50 does not adhere to the front surface 20B. The resin layer 50 covers the bump 25 provided between the semiconductor chip 20 and the wiring substrate 30, and is formed at the lower portion of the side surface 20C of the semiconductor chip 20.

It is preferred that a thickness of the semiconductor chip 20 is, for example, 20 μm to 70 μm. When the thickness of the semiconductor chip 20 is less than 20 μm, an operation of the semiconductor chip becomes difficult due to an influence of a depletion layer of a transistor formed in the semiconductor chip 20. On the other hand, when the thickness of the semiconductor chip 20 exceeds 70 μm, the resin layer 50 may not reach the adhesive layer 40. In this case, the side surface 20C of the semiconductor chip 20 may not be covered with the resin layer 50 and may not be protected.

In this case, the sealing resin 70 may contact the side surface 20C of the semiconductor chip 20.

The mounting tool MT stacks another semiconductor chip 15 on the semiconductor chip 10. The semiconductor chip 15 adheres to the front surface 10B of the semiconductor chip 10 by the adhesive layer 45.

Next, the bonding wire 60 is used to connect the semiconductor chips 10, 15 and 20, and the pad of the wiring substrate 30. After that, in a molding step, the semiconductor chips 10, 20, and 15 on the wiring substrate 30 are resin-sealed with the sealing resin 70. Accordingly, the package of the semiconductor device 1 illustrated in FIG. 1 is completed.

As described above, according to the embodiment, after the semiconductor chip 20 adheres to the semiconductor chip 10, the semiconductor chip 20 is flip-chip connected to the wiring substrate 30 together with the semiconductor chip 10.

When only the semiconductor chip 20 is flip-chip connected to the wiring substrate 30, the mounting tool MT sucks the semiconductor chip 20, and connects the bump 25 to the wiring substrate 30 while the semiconductor chip 20 contacts the resin layer 50 on the wiring substrate 30. In this case, the resin layer 50 creeps up along the side surface 20C of the semiconductor chip 20. It is conceivable to protect a front surface of the mounting tool with a film (not illustrated) so that the underfill does not adhere to the mounting tool MT. However, in this case, as described above, it is required to form the suction hole in the film for each semiconductor chip 20, thereby causing the deterioration in throughput. Since the film is exchanged for each mounting process, the cost of the film is high. The resin layer 50 also goes around on the front surface 20B of the semiconductor chip 20, and the resin layer 50 enters between the semiconductor chip 20 and the adhesive layer 40. In this case, the semiconductor chip 20 and the adhesive layer 40 may be peeled off during a moisture absorption reflow of a reliability test.

On the other hand, in the method for manufacturing according to the embodiment, after the semiconductor chip 20 adheres to the semiconductor chip 10, the semiconductor chip 20 is flip-chip connected to the wiring substrate 30 together with the semiconductor chip 10. As described above, the order of the stacking step of the semiconductor chips 10 and 20 and the flip-chip connection step of the semiconductor chip 20 is reversed. Accordingly, even though the resin layer 50 creeps up along the side surface 20C of the semiconductor chip 20, the semiconductor chip 10 prevents the resin layer 50 from reaching the mounting tool MT. Therefore, the embodiment can shorten the throughput and reduce the manufacturing cost without requiring the film for covering the mounting tool MT.

Since the stacking step of the semiconductor chips 10 and 20 is performed before the flip-chip connection step of the semiconductor chips 20, the resin layer 50 does not go around the front surface 20B of the semiconductor chip 20. That is, even though the resin layer 50 creeps up the side surface 20C of the semiconductor chip 20, the adhesive layer 40 already adheres to the front surface 20B of the semiconductor chip 20, such that the resin layer 50 does not contact the front surface 20B of the semiconductor chip 20. On the other hand, as illustrated in FIG. 2, the adhesive layer 40 also contact the front surface 20B of the semiconductor chip 20 and the upper portion of the side surfaces 20C thereof. Therefore, the adhesiveness between the semiconductor chip 20 and the adhesive layer 40 is improved, and it is possible to prevent the semiconductor chip 20 and the adhesive layer 40 from being peeled off in the moisture absorption reflow of the reliability test.

It is desirable that the semiconductor chip 10 is larger than the semiconductor chip 20, and the outer edge of the semiconductor chip 10 is outside (offset from) the outer edge of the semiconductor chip 20, when viewed from above the front surface 10B of the semiconductor chip 10. This more effectively prevents the resin layer 50 from reaching the mounting tool MT.

However, it is not necessarily required that the semiconductor chip 10 should be larger than the semiconductor chip 20. Even though a size of the semiconductor chip 10 is equal to or smaller than a size of the semiconductor chip 20, the semiconductor chip 10 can cause the mounting tool MT and the semiconductor chip 20 to be separated from each other by the thickness thereof. Therefore, the effect of the embodiment can be obtained only by reversing the order of the stacking step of the semiconductor chips 10 and 20 and the flip-chip connection step of the semiconductor chip 20.

The resin layer 50 fills a periphery of the bump 25 provided between the rear surface 20A of the semiconductor chip 20 and the wiring substrate 30. As illustrated in FIG. 2, the resin layer 50 contacts a part of the bottom surface of the adhesive layer 40 along the side surface 20C of the semiconductor chip 20. Accordingly, the side surface 20C of the semiconductor chip 20 can be protected well.

The semiconductor chip 20 is flip-chip connected to the wiring substrate 30 in a state of adhering to the semiconductor chip 10. Therefore, even though the thickness of the semiconductor chip 20 is as thin as 70 μm or less, the warpage of the semiconductor chip 20 is corrected by the semiconductor chip 10. As a result, the bump 25 can be surely connected to the wiring substrate 30 in the flip-chip connection.

Second Embodiment

In the first embodiment, as illustrated in FIGS. 5 and 6, in order to perform dicing alignment, the semiconductor wafer 10W is moved from the resin tape TP1 to the resin tape TP2, and the front surface 10B of the semiconductor wafer 10W is directed upward.

However, for example, when the alignment is performed by using an infrared ray, the alignment can be performed from the rear surface 10A of the semiconductor wafer 10W. In this case, it is not required to move the semiconductor wafer 10W from the resin tape TP1 to the resin tape TP2. Therefore, in the second embodiment, the semiconductor wafer 10W is polished, diced, and stuck to the semiconductor chip 20 by commonly using the resin tape TP1.

Figure 4:
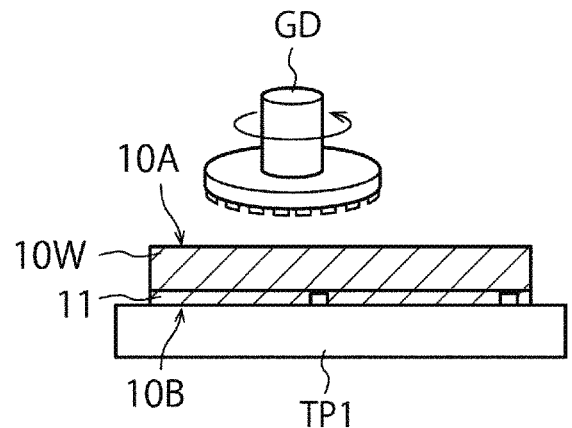
FIG. 4 is a cross-sectional view illustrating an example of a method for manufacturing the semiconductor device according to the first embodiment.
Figure 12:
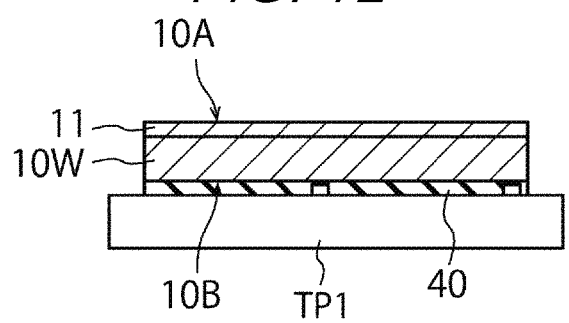
FIG. 12 is a cross-sectional view illustrating an example of a method for manufacturing a semiconductor device according to a second embodiment.
Figure 13:
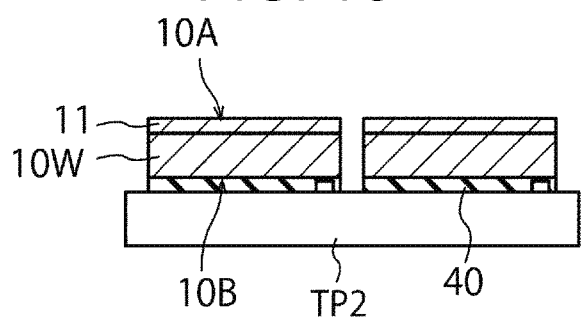
FIG. 13 is a cross-sectional view illustrating an example of the method for manufacturing, following FIG. 12.

FIGS. 12 and 13 are cross-sectional views illustrating examples of a method for manufacturing a semiconductor device according to the second embodiment. As illustrated in FIG. 4, the front surface 10B of the semiconductor wafer 10W is stuck to the resin tape TP1, the rear surface 10A of the semiconductor wafer 10W is polished on the resin tape TP1 as it is, and the adhesive layer 40 is formed on the rear surface 10A.

As illustrated in FIGS. 12 and 13, while the semiconductor wafer 10W is stuck to the resin tape TP1, the semiconductor wafer 10W is diced such that the semiconductor wafer 10W is diced into the individual semiconductor chips 10. Next, as illustrated in FIG. 8, the front surface 20B of the semiconductor chip 20 adheres to the adhesive layer 40 of the rear surface 10A of the semiconductor chip 10. Thereafter, by going through the steps illustrated in FIGS. 9 to 11, the package of the semiconductor device 1 illustrated in FIG. 1 is completed.

According to the second embodiment, since it is not required to change the resin tape frequently, throughput can be further shortened and manufacturing cost can be further reduced.

A configuration of the second embodiment may be the same as that of the first embodiment. Therefore, the second embodiment can also obtain the effect of the first embodiment.

Third Embodiment

Figure 14:
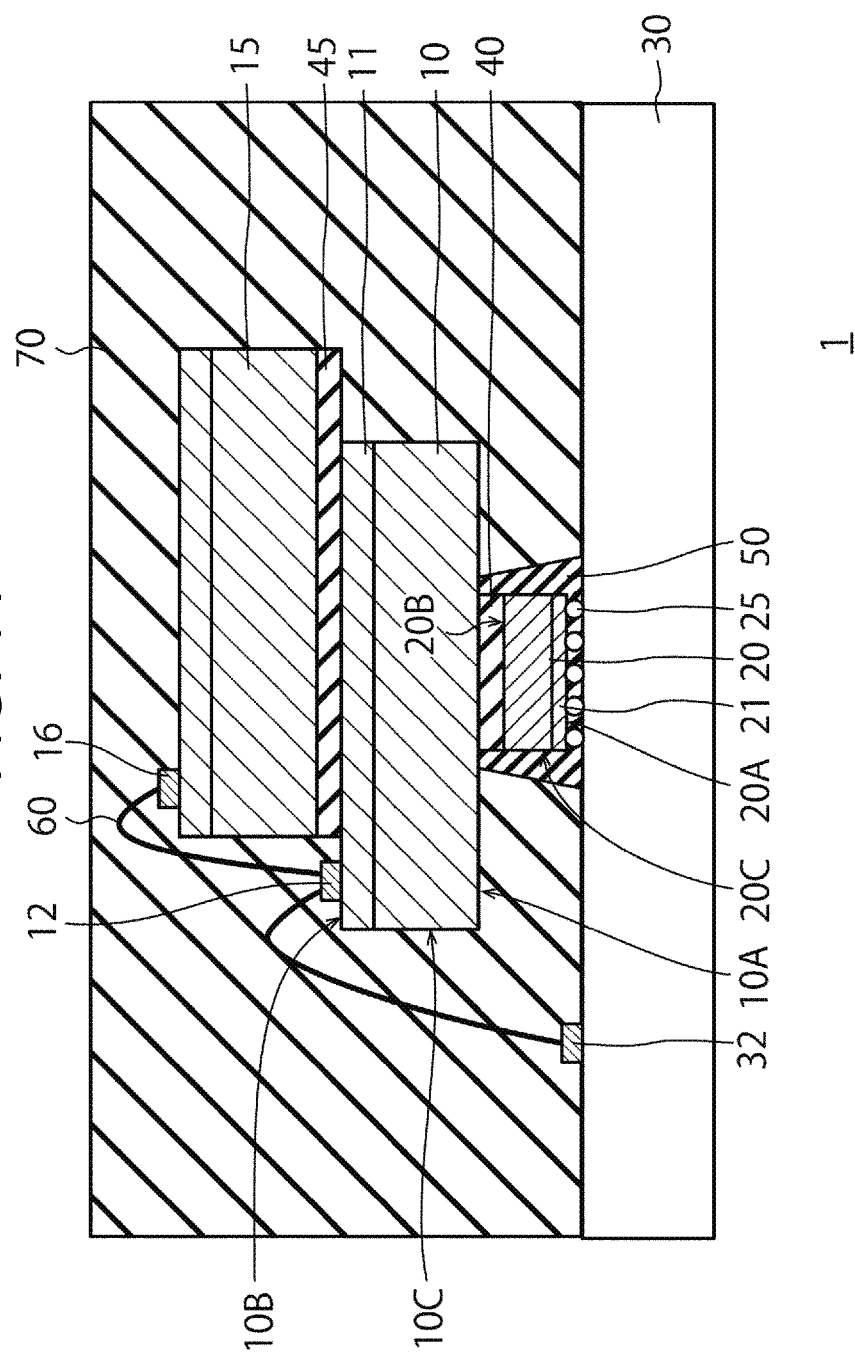
FIG. 14 is a cross-sectional view illustrating a configuration example of a semiconductor device according to a third embodiment.

FIG. 14 is a cross-sectional view illustrating a configuration example of a semiconductor device according to a third embodiment. According to the third embodiment, the adhesive layer 40 is provided with a approximately equal size of the front surface 20B of the semiconductor chip 20. The adhesive layer 40 is not provided on the whole rear surface 10A of the semiconductor chip 10, but is provided on a part of an area of the rear surface 10A. Other configurations of the third embodiment may be the same as the corresponding configurations of the first or second embodiment. Therefore, the third embodiment can obtain the same effect as that of the first or second embodiment.

Figure 15:
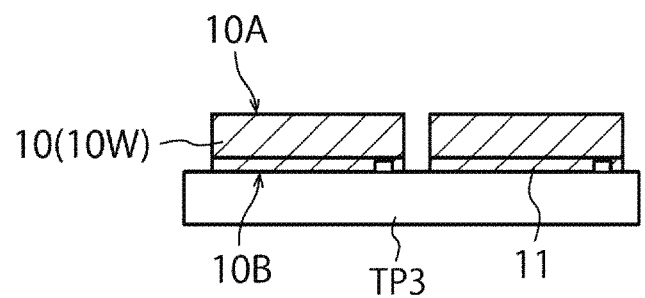
FIG. 15 is a cross-sectional view illustrating an example of a method for manufacturing the semiconductor device according to the third embodiment.
Figure 16:
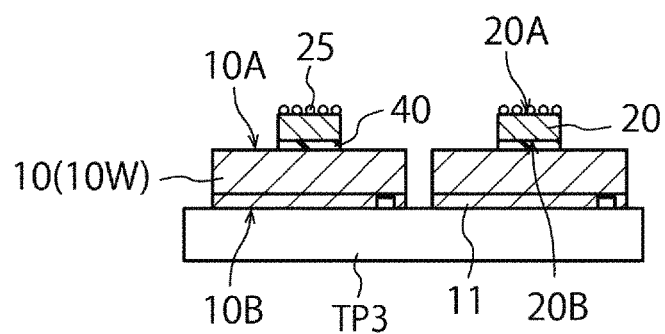
FIG. 16 is a cross-sectional view illustrating an example of the method for manufacturing, following FIG. 15.

FIGS. 15 and 16 are cross-sectional views illustrating examples of a method for manufacturing the semiconductor device according to the third embodiment. After going through the step in FIG. 4, as illustrated in FIG. 15, the semiconductor wafer 10W is diced such that the semiconductor wafer 10W is diced into the individual semiconductor chips 10 while the semiconductor wafer 10W is stuck to the resin tape TP3. At this time, the adhesive layer 40 is not stuck to the semiconductor wafer 10W.

Although not illustrated in FIG. 15, the adhesive layer 40 is stuck to the semiconductor chip 20. That is, the adhesive layer 40 is stuck to the front surface 20B of the semiconductor wafer before the semiconductor chip 20 is diced. The semiconductor chip 20 including the adhesive layer 40 is formed by dicing this semiconductor wafer into individual pieces. The adhesive layer 40 is cut into the same size as that of the semiconductor chip 20 by dicing.

Next, as illustrated in FIG. 16, the semiconductor chip 20 is disposed on the rear surface 10A of the semiconductor chip 10. Accordingly, the semiconductor chip 20 is stuck to the rear surface 10A of the semiconductor chip 10 by the adhesive layer 40.

Figure 11:
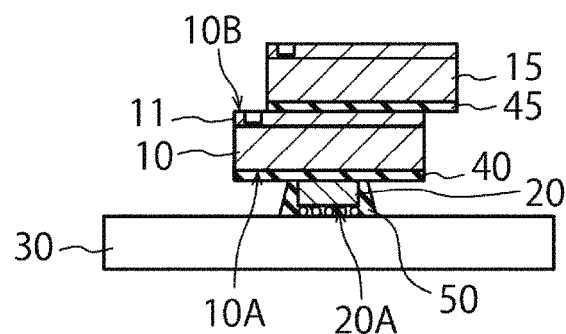
FIG. 11 is a cross-sectional view illustrating an example of the method for manufacturing, following FIG. 10.

Thereafter, by going through the steps illustrated in FIGS. 9 to 11, the package of the semiconductor device 1 illustrated in FIG. 14 is completed.

In the third embodiment, the adhesive layer 40 does not cover the whole rear surface 10A of the semiconductor chip 10. However, the adhesive layer 40 fills a whole space between the semiconductor chip 10 and the semiconductor chip 20. Therefore, also in the third embodiment, the resin layer 50 does not contact the front surface 20B of the semiconductor chip 20. Accordingly, the third embodiment can obtain the effect of the first embodiment. In the third embodiment, in the same manner as that of the second embodiment, since it is not required to change the resin tape frequently, the same effect as that of the second embodiment can be obtained.

Fourth Embodiment

Figure 17:
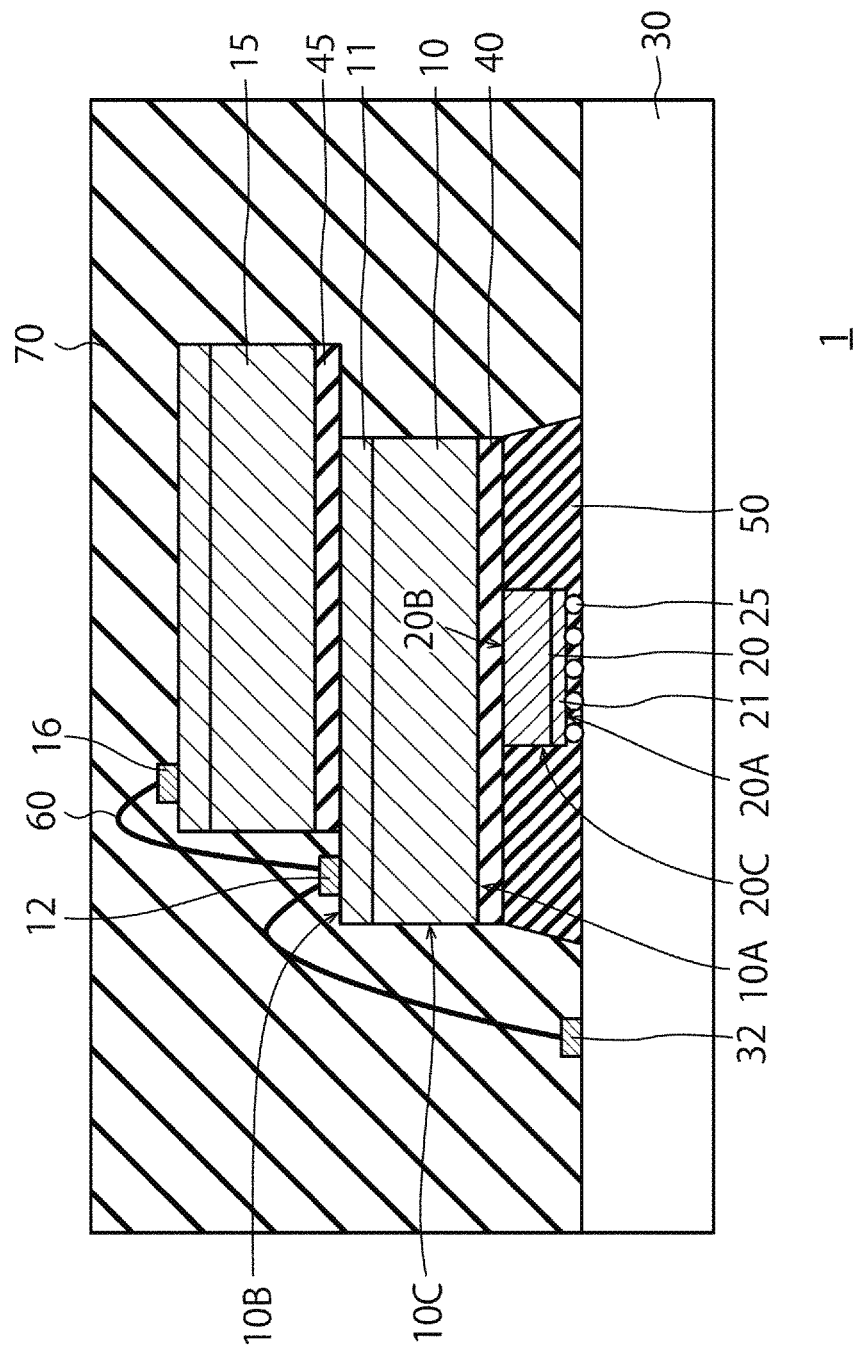
FIG. 17 is a cross-sectional view illustrating a configuration example of a semiconductor device according to a fourth embodiment.

FIG. 17 is a cross-sectional view illustrating a configuration example of a semiconductor device according to a fourth embodiment. According to the fourth embodiment, the resin layer 50 is entirely provided directly under the rear surface 10A of the semiconductor chip 10. That is, the resin layer 50 is entirely filled between the rear surface 10A of the semiconductor chip 10 and the front surface of the wiring substrate 30.

In the step illustrated in FIG. 9, the resin layer 50 may be configured so that an amount of the liquid material of the resin layer 50 supplied to the wiring substrate 30 is approximately equal to a volume of a space between the rear surface 10A of the semiconductor chip 10 and the front surface of the wiring substrate 30. Alternatively, after the semiconductor chip 20 is flip-chip connected to the wiring substrate 30 together with the semiconductor chip 10, the liquid material of the resin layer 50 may be supplied so as to fill the space between the rear surface 10A of the semiconductor chip 10 and the front surface of the wiring substrate 30. The resin layer 50 fills the space between the outer edge of the rear surface 10A of the semiconductor chip 10 and the wiring board 30.

When the resin layer 50 is solidified, the semiconductor chip 10 can be supported. Accordingly, in the fourth embodiment, a spacer chip which will be described later is not required. Other configurations of the fourth embodiment may be the same as those of the first embodiment. As a result, the fourth embodiment can obtain the same effect as that of the first embodiment.

Fifth Embodiment

Figure 18:
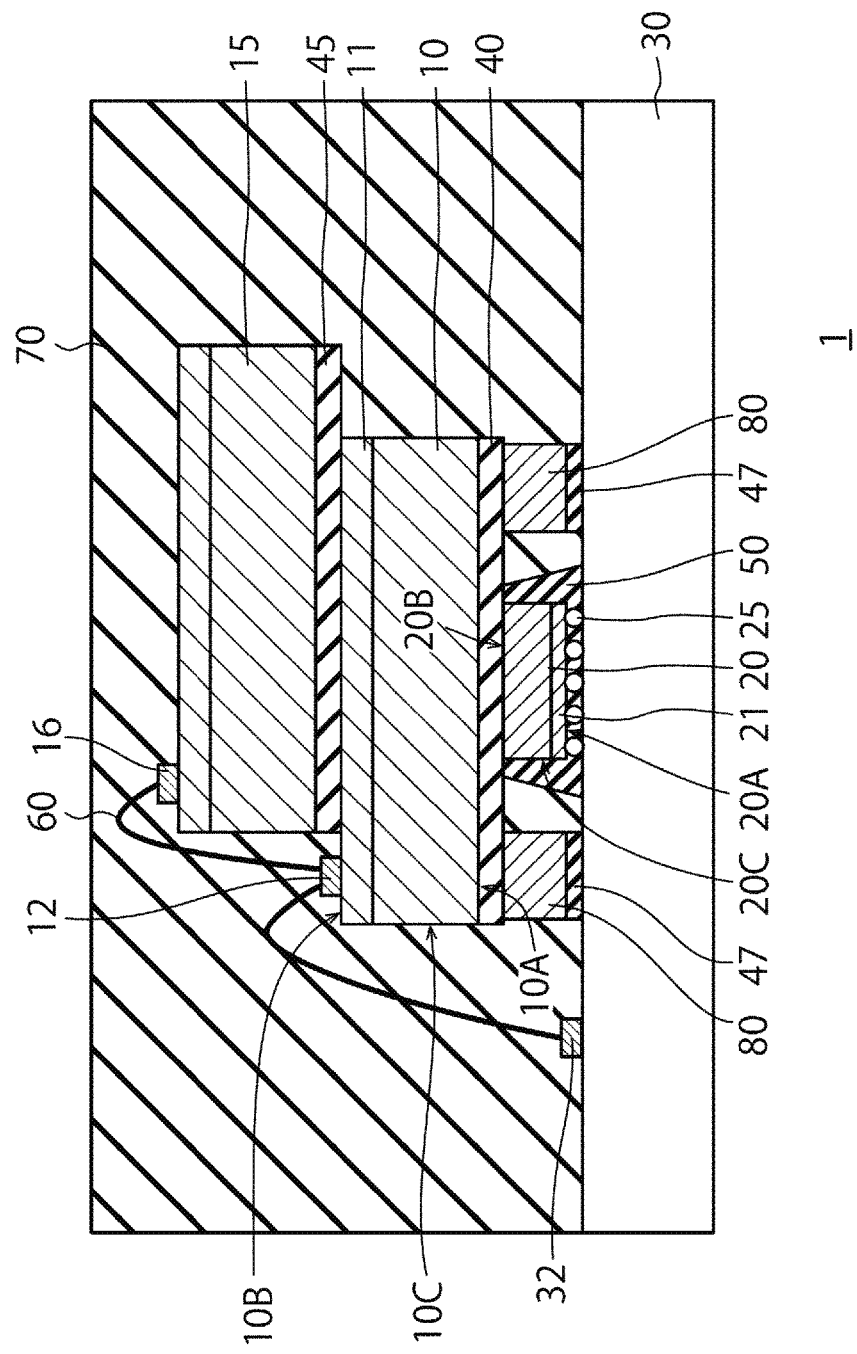
FIG. 18 is a cross-sectional view illustrating a configuration example of a semiconductor device according to a fifth embodiment.

FIG. 18 is a cross-sectional view illustrating a configuration example of a semiconductor device according to a fifth embodiment. According to the fifth embodiment, spacer chips 80 are disposed on opposite sides of the semiconductor chip 20. The spacer chip 80 is provided directly under the rear surface 10A of the semiconductor chip 10. That is, the spacer chip 80 is provided between the semiconductor chip 10 and the wiring substrate 30 around a periphery of the semiconductor chip 20. When viewed from above the front surface 10B of the semiconductor chip 10, the spacer chip 80 may have a rectangular frame shape so as to surround the periphery of the semiconductor chip 20. Alternatively, the spacer chip 80 may be divided and disposed in four sides of the semiconductor chip 20.

The rear surface of the spacer chip 80 adheres to the front surface of the wiring substrate 30 by an adhesive layer 47. The front surface of the spacer chip 80 adheres to the adhesive layer 40 on the rear surface 10A of the semiconductor chip 10. The sealing resin 70 is embedded around a periphery of the spacer chip 80 between the semiconductor chip 10 and the wiring substrate 30.

The spacer chip 80 has almost the same thickness as the semiconductor chip 20. The spacer chip 80 may be formed of the same material as the substrate of the semiconductor chip (for example, a silicon substrate). Accordingly, the spacer chip 80 can support the semiconductor chip 10 around the periphery of the semiconductor chip 20, correct the warpage of the semiconductor chip 10, and flatten the semiconductor chip 10. Other configurations of the fifth embodiment may be the same as those of the first embodiment, and can further obtain the same effect as that of the first embodiment.

Figure 19:
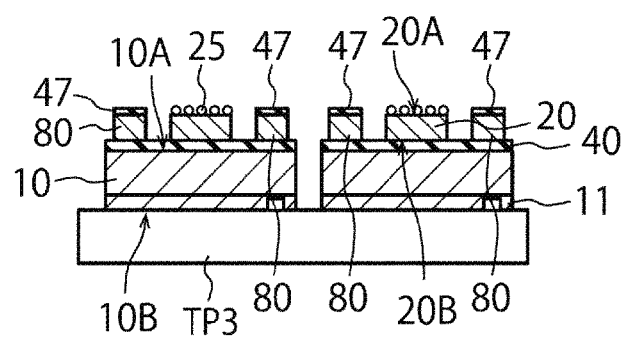
FIG. 19 is a cross-sectional view illustrating an example of a method for manufacturing the semiconductor device according to the fifth embodiment.
Figure 20:
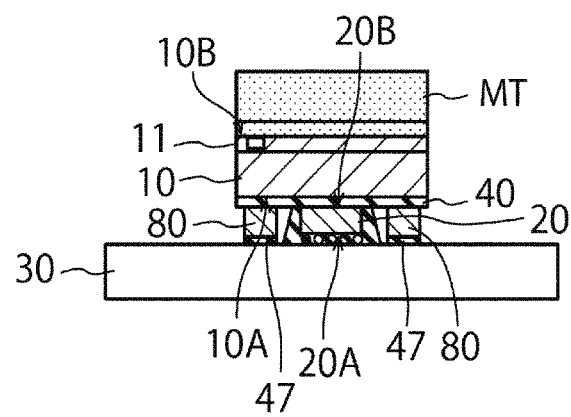
FIG. 20 is a cross-sectional view illustrating an example of the method for manufacturing, following FIG. 19.

FIGS. 19 and 20 are cross-sectional views illustrating examples of a method for manufacturing the semiconductor device according to the fifth embodiment. After going through the steps of FIGS. 4 to 8, as illustrated in FIG. 19, the spacer chip 80 adheres to the adhesive layer 40 around the periphery of the semiconductor chip 20. The spacer chip 80 is provided with the adhesive layer 47 before adhering to the adhesive layer 40 therearound. Next, after going through the step illustrated in FIG. 9, the semiconductor chips 10 and 20 are picked up by the mounting tool MT. Next, as illustrated in FIG. 20, the rear surface 10A of the semiconductor chip 10 and the rear surface 20A of the semiconductor chip 20 are opposite to the front surface of the wiring substrate 30, and the semiconductor chip 20 is flip-chip connected to the wiring substrate 30. When the bump 25 of the semiconductor chip 20 is connected to the wiring substrate 30, the spacer chip 80 is provided between the semiconductor chip 10 and the wiring substrate 30. The adhesive layer 47 adheres the spacer chip 80 to the wiring substrate 30 when the semiconductor chip 20 is flip-chip connected to the wiring substrate 30.

Thereafter, the semiconductor device 1 illustrated in FIG. 18 is completed by going through the step of FIG. 11.

According to the fifth embodiment, the spacer chip 80 can support the semiconductor chip 10 around the periphery of the semiconductor chip 20, correct the warpage of the semiconductor chip 10, and flatten the semiconductor chip 10.

(Modification)

Figure 21:
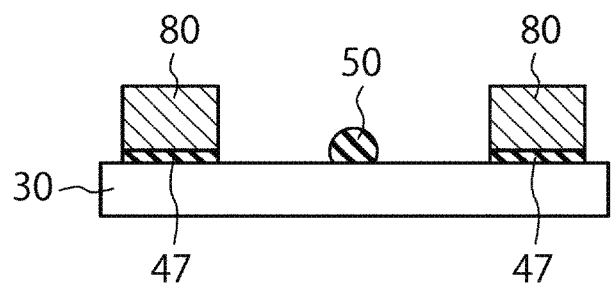
FIG. 21 is a cross-sectional view illustrating an example of a method for manufacturing a semiconductor device according to a modification of the fifth embodiment.

FIG. 21 is a cross-sectional view illustrating an example of a method for manufacturing a semiconductor device according to a modification of the fifth embodiment. In this modification, the spacer chip 80 adheres to the wiring substrate 30 before the semiconductor chip 20 is flip-chip connected to the wiring substrate 30. Thereafter, the semiconductor chip 20 is flip-chip connected to the wiring substrate 30 by going through the steps illustrated in FIGS. 10 and 11. As a result, the semiconductor device 1 having the same structure as that of the fifth embodiment can be obtained.

Sixth Embodiment

Figure 22:
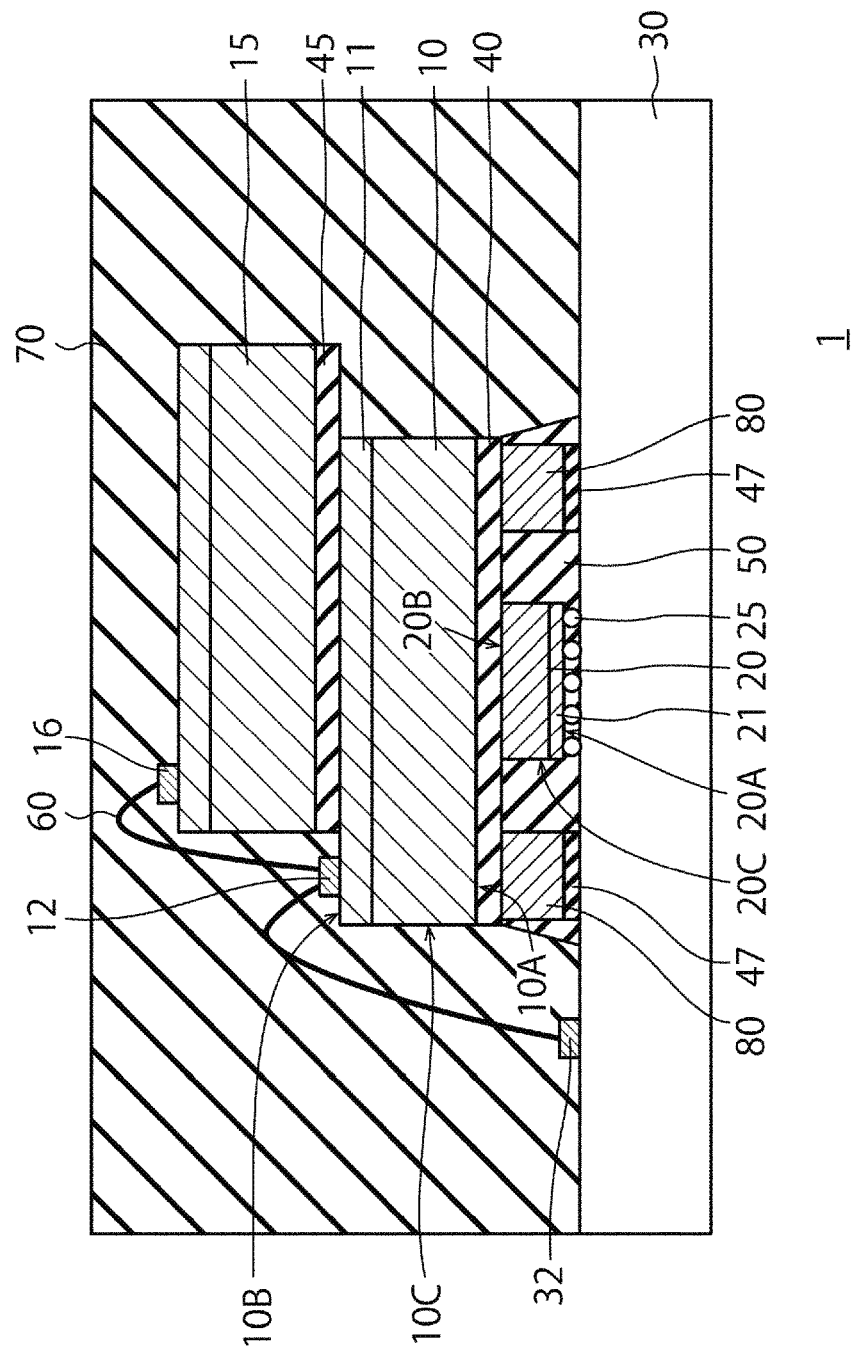
FIG. 22 is a cross-sectional view illustrating a configuration example of a semiconductor device according to a sixth embodiment.

FIG. 22 is a cross-sectional view illustrating a configuration example of a semiconductor device according to a sixth embodiment. The sixth embodiment is a combination of the fourth and fifth embodiments. According to the sixth embodiment, in the same manner as that of the fifth embodiment, the spacer chip 80 is provided between the semiconductor chip 10 and the wiring substrate 30 around the periphery of the semiconductor chip 20.

The resin layer 50 is entirely filled between the rear surface 10A of the semiconductor chip 10 and the front surface of the wiring substrate 30. Accordingly, the peripheries of the semiconductor chip 20 and the spacer chip 80 (the side surfaces thereof) are covered and protected by the resin layer 50.

Other configurations of the sixth embodiment may be the same as those of the fourth or fifth embodiment. Therefore, the sixth embodiment can obtain the effect of the fourth and fifth embodiments.

Seventh Embodiment

Figure 23:
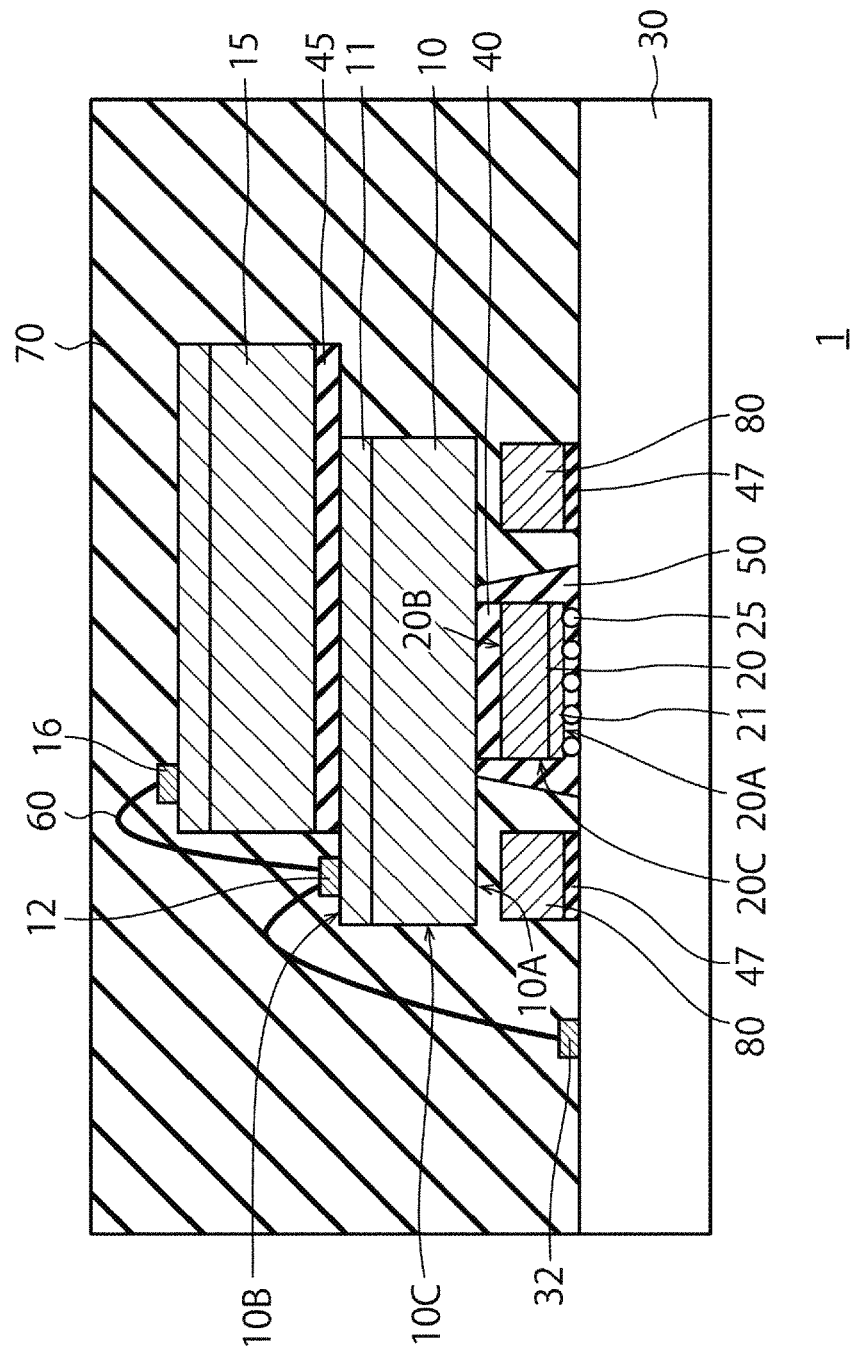
FIG. 23 is a cross-sectional view illustrating a configuration example of a semiconductor device according to a seventh embodiment.

FIG. 23 is a cross-sectional view illustrating a configuration example of a semiconductor device according to a seventh embodiment. The seventh embodiment is an embodiment in which the spacer chip 80 of the fifth embodiment is combined with the third embodiment. Therefore, the adhesive layer 40 is provided with the size of the front surface 20B of the semiconductor chip 20, and is provided only between the front surface 20B of the semiconductor chip 20 and the rear surface 10A of the semiconductor chip 10. The spacer chip 80 is provided between the semiconductor chip 10 and the wiring substrate 30 around the periphery of the semiconductor chip 20. Therefore, the adhesive layer 40 is not provided between the spacer chip 80 and the semiconductor chip 10, and the sealing resin 70 is filled between the spacer chip 80 and the semiconductor chip 10.

Other configurations of the seventh embodiment may be the same as the corresponding configurations of the third or fifth embodiment. Therefore, the seventh embodiment can obtain the effect of the third and fifth embodiments.

In the seventh embodiment, the spacer chip 80 does not adhere to the semiconductor chip 10 by the adhesive layer 40. Therefore, in the method for manufacturing according to the seventh embodiment, the spacer chip 80 of the seventh embodiment may adhere to the wiring substrate 30 with the adhesive layer 47 before the semiconductor chip 20 is flip-chip connected to the wiring substrate 30 as shown in the modification of the fifth embodiment. Accordingly, the spacer chip 80 is fixed to a predetermined location of the wiring substrate 30 by the adhesive layer 47.

Eighth Embodiment

Figure 24:
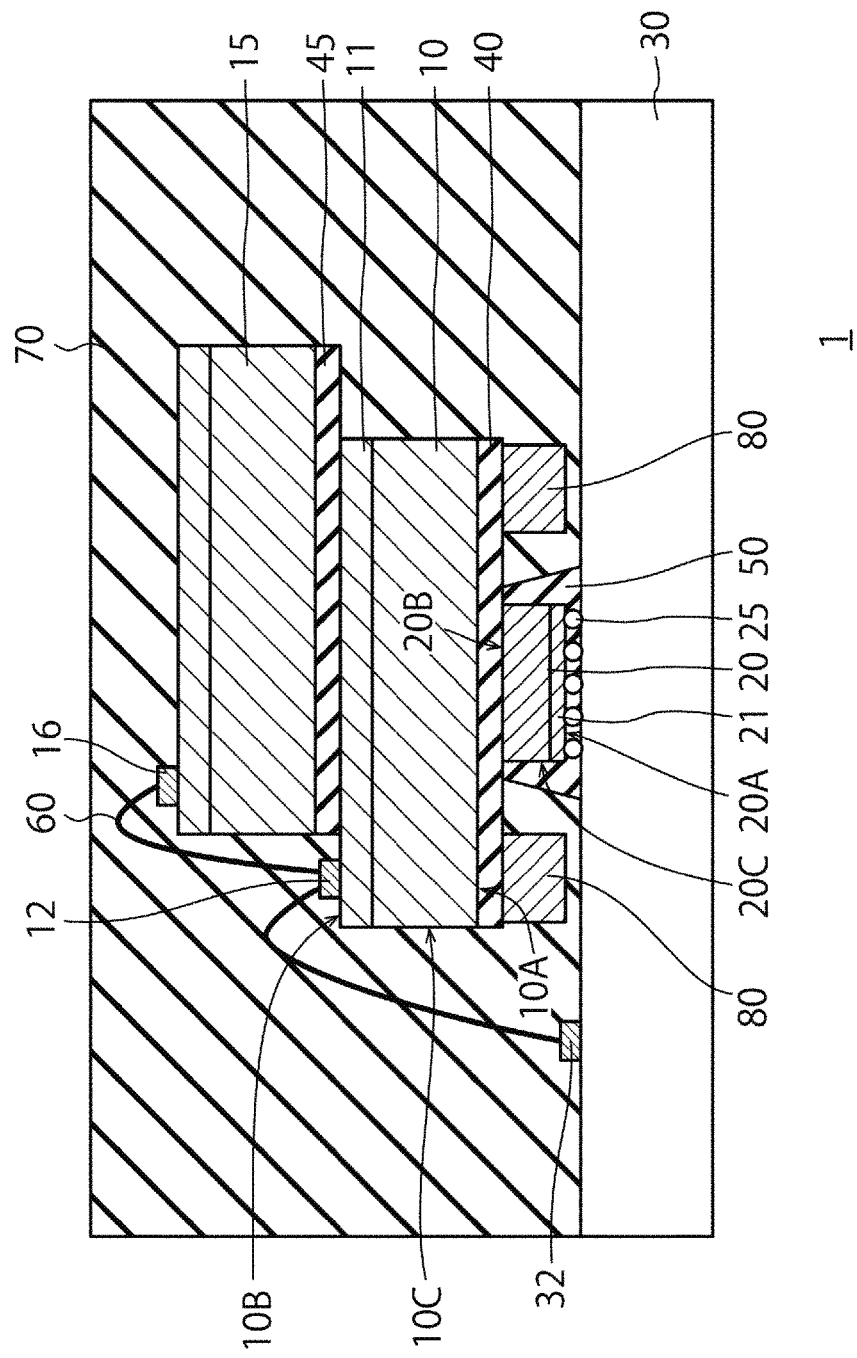
FIG. 24 is a cross-sectional view illustrating a configuration example of a semiconductor device according to an eighth embodiment.

FIG. 24 is a cross-sectional view illustrating a configuration example of a semiconductor device according to an eighth embodiment. In the eighth embodiment, the adhesive layer 47 is not provided under the spacer chip 80 of the fifth embodiment. The sealing resin 70 is filled between the spacer chip 80 and the wiring substrate 30. On the other hand, the spacer chip 80 adheres to the adhesive layer 40.

Other configurations of the eighth embodiment may be the same as the corresponding configurations of the fifth embodiment. Therefore, the eighth embodiment can obtain the effect of the fifth embodiment.

In the eighth embodiment, since the adhesive layer 47 is not provided, in the method for manufacturing according to the eighth embodiment, the spacer chip 80 adheres to the semiconductor chip 10 via the adhesive layer 40 in the same manner as that of the fifth embodiment. As a result, the spacer chip 80 is disposed at a predetermined location of the wiring substrate 30 when the semiconductor chip 20 is flip-chip connected to the wiring substrate 30.

Ninth Embodiment

Figure 25:
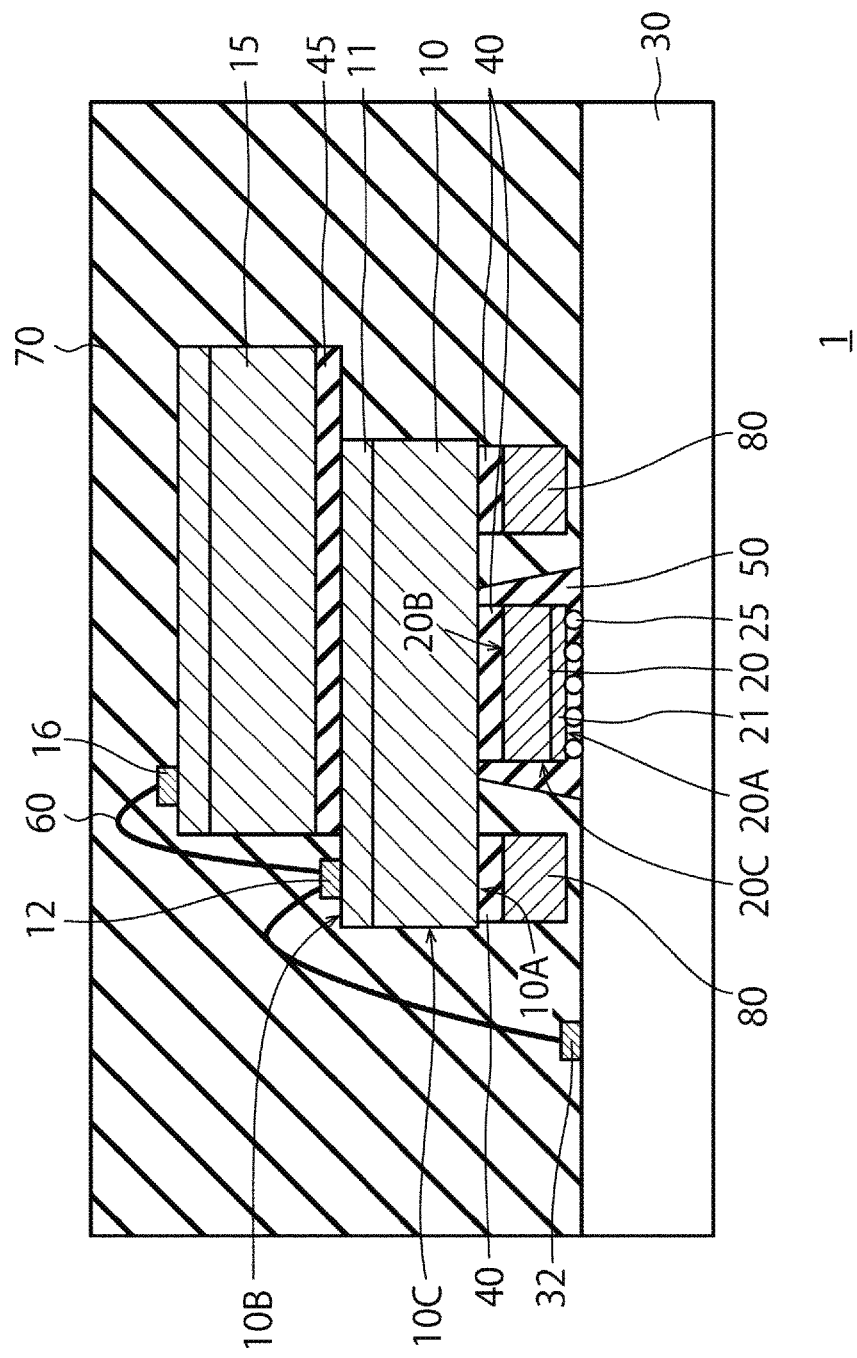
FIG. 25 is a cross-sectional view illustrating a configuration example of a semiconductor device according to a ninth embodiment.

FIG. 25 is a cross-sectional view illustrating a configuration example of a semiconductor device according to a ninth embodiment. In the ninth embodiment, the adhesive layer 40 of the eighth embodiment is not continuously provided in the semiconductor chip 20 and the spacer chip 80, and each adhesive layer 40 is isolated from each other. Therefore, each adhesive layer 40 is provided corresponding to a portion between the semiconductor chip 20 and the semiconductor chip 10 and a portion between the spacer chip 80 and the semiconductor chip 10. Other configurations of the ninth embodiment may be the same as the corresponding configurations of the eighth embodiment. Therefore, the ninth embodiment can obtain the effect of the eighth embodiment.

In the method for manufacturing according to the ninth embodiment, the adhesive layer 40 is provided in the spacer chip 80 before the semiconductor chip 20 is flip-chip connected to the wiring substrate 30, and the spacer chip 80 adheres to the semiconductor chip 10. Accordingly, the spacer chip 80 is disposed at a predetermined location of the wiring substrate 30 when the semiconductor chip 20 is flip-chip connected to the wiring substrate 30.

Tenth Embodiment

Figure 26:
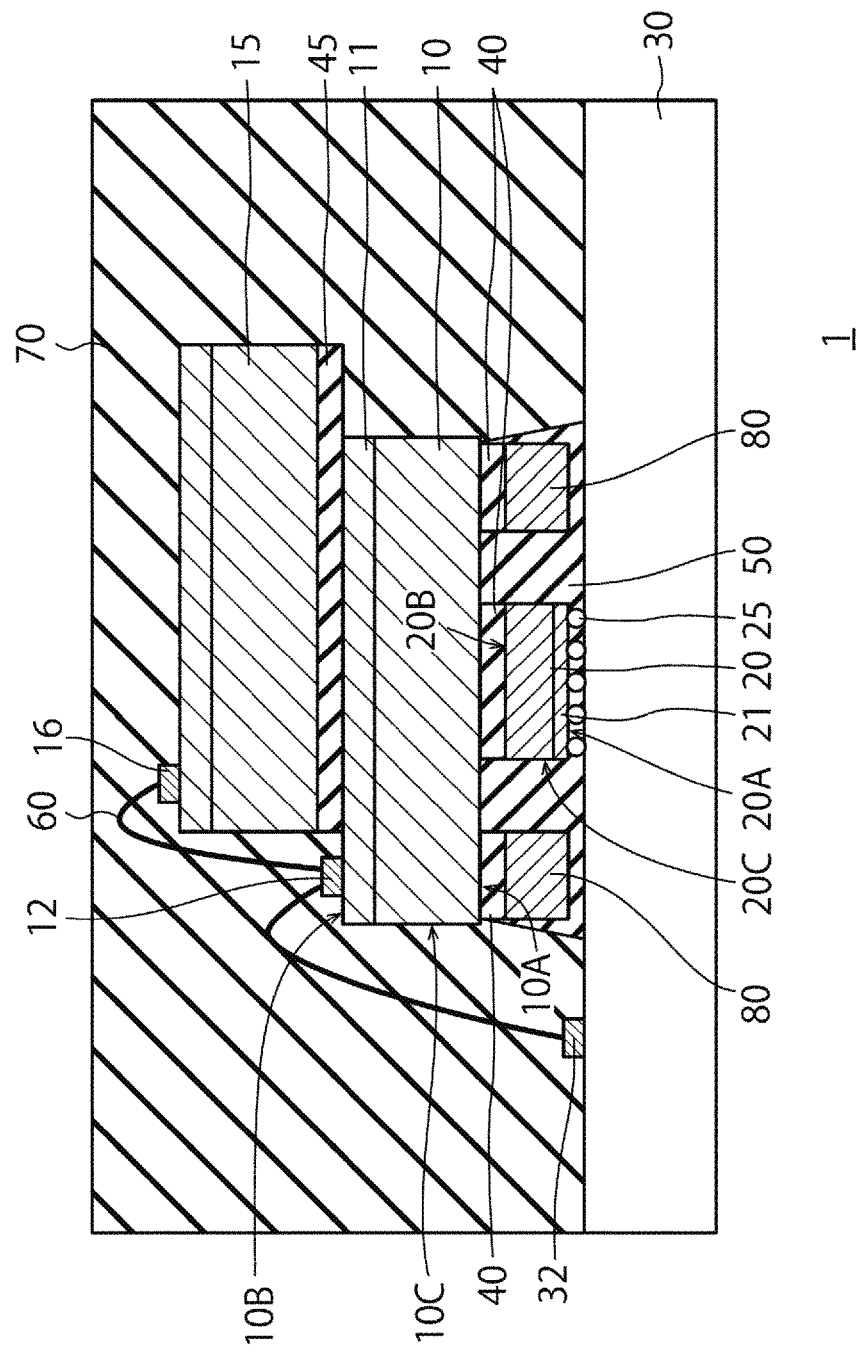
FIG. 26 is a cross-sectional view illustrating a configuration example of a semiconductor device according to a tenth embodiment.

FIG. 26 is a cross-sectional view illustrating a configuration example of a semiconductor device according to a tenth embodiment. The tenth embodiment is a combination of the fourth and ninth embodiments. According to the tenth embodiment, around the peripheries of the semiconductor chip 20 and the spacer chip 80, the resin layer 50 is entirely filled between the rear surface 10A of the semiconductor chip 10 and the front surface of the wiring substrate 30. Accordingly, the peripheries of the semiconductor chip 20 and the spacer chip 80 (the side surfaces thereof) are covered and protected by the resin layer 50. The resin layer 50 is also filled between the spacer chip 80 and the wiring substrate 30.

Other configurations of the tenth embodiment may be the same as the corresponding configurations of the fourth and ninth embodiments. Therefore, the tenth embodiment can obtain the effect of the fourth and ninth embodiments.

Eleventh Embodiment

FIG. 27 is a cross-sectional view illustrating a configuration example of a semiconductor device according to an eleventh embodiment. The eleventh embodiment is a combination of the fourth and seventh embodiments. According to the eleventh embodiment, around the peripheries of the semiconductor chip 20 and the spacer chip 80, the resin layer 50 is entirely filled between the rear surface 10A of the semiconductor chip 10 and the front surface of the wiring substrate 30. Accordingly, the peripheries of the semiconductor chip 20 and the spacer chip 80 (the side surfaces thereof) are covered and protected by the resin layer 50. The resin layer 50 is also filled between the spacer chip 80 and the semiconductor chip 10.

Other configurations of the eleventh embodiment may be the same as the corresponding configurations of the fourth and seventh embodiment. Therefore, the eleventh embodiment can obtain the effect of the fourth and seventh embodiments.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
   a first semiconductor chip having a first surface and a second surface opposite to the first surface;
   a first resin layer provided on the first surface;
   a second semiconductor chip including:
      a third surface and a fourth surface opposite to the third surface; and
      a connection bump on the third surface;
   a wiring substrate connected to the connection bump; and
   a second resin layer that covers the connection bump between the second semiconductor chip and the wiring substrate, and further covers at least one side surface of the second semiconductor chip connecting the third surface and the fourth surface,
   wherein the first resin layer covers an upper portion of the at least one side surface,
   the second resin layer covers a lower portion of the at least one side surface, and
   the first resin layer and the second resin layer contact each other.

2. The semiconductor device according to claim 1,
   wherein the second resin layer includes a recess between the first resin layer and the at least one side surface, and
   the first resin layer includes a protruding portion contacting the recess.

3. The semiconductor device according to claim 1,
   wherein the second resin layer covers the second semiconductor chip by extending from the third surface to halfway of the at least one side surface.

4. The semiconductor device according to claim 1,
   wherein the first resin layer covers the second semiconductor chip by extending from the fourth surface to halfway of the at least one side surface.

5. The semiconductor device according to claim 1,
   wherein an outer edge of the first semiconductor chip is offset from an outer edge of the second semiconductor chip, and
   the second resin layer is further provided between the first surface of the first semiconductor chip and the wiring substrate.

6. The semiconductor device according to claim 1, further comprising:
   a third semiconductor chip provided between the first semiconductor chip and the wiring substrate around a periphery of the second semiconductor chip,
   wherein an outer edge of the first semiconductor chip is offset from an outer edge of the second semiconductor chip.

7. The semiconductor device according to claim 1, further comprising:
   a spacer chip provided between the first semiconductor chip and the wiring substrate around a periphery of the second semiconductor chip; and
   a third resin layer that embeds a periphery of the spacer chip,
   wherein an outer edge of the first semiconductor chip is offset from an outer edge of the second semiconductor chip.

8. The semiconductor device according to claim 7, wherein each of the second and third resin layers includes an underfill or a non-conductive paste (NCP).

* * * * *